(12) United States Patent
Miettinen

(10) Patent No.: US 6,184,740 B1
(45) Date of Patent: Feb. 6, 2001

(54) CONTROL CIRCUIT

(75) Inventor: Erkki Miettinen, Helsinki (FI)

(73) Assignee: ABB Industry Oy, Helsinki (FI)

( * ) Notice: Under 35 U.S.C. 154(b), the term of this patent shall be extended for 0 days.

(21) Appl. No.: 09/357,240

(22) Filed: Jul. 19, 1999

(30) Foreign Application Priority Data

Aug. 12, 1998 (FI) .................................................. 981740
Sep. 23, 1998 (FI) .................................................. 982046

(51) Int. Cl.$^7$ ................................................ H03K 17/687
(52) U.S. Cl. ........................................ 327/434; 327/109
(58) Field of Search .................................. 307/125, 126, 307/130; 323/901; 327/108, 109, 432, 433, 434, 435, 427

(56) References Cited

U.S. PATENT DOCUMENTS

| 4,922,365 | * | 5/1990 | Moru ........................... 361/18 |
| 5,646,514 | * | 7/1997 | Tsunetsugu ................... 323/288 |
| 5,675,244 | * | 10/1997 | Piton .......................... 323/901 |
| 5,808,504 | * | 9/1998 | Chikai et al. ................ 327/434 |
| 5,825,539 | | 10/1998 | Bijlenga et al. . | |
| 5,977,814 | * | 11/1999 | Ishii .......................... 327/434 |

FOREIGN PATENT DOCUMENTS

| 195 12911 | 5/1996 | (DE) . |
| 0 493 185 | 7/1992 | (EP) . |
| 0 614 278 | 9/1994 | (EP) . |
| 743 751 | 11/1996 | (EP) . |
| 0 814 564 | 12/1997 | (EP) . |
| 96/27230 | 9/1996 | (WO) . |
| 98/01940 | 1/1998 | (WO) . |

OTHER PUBLICATIONS

DATABASE WPI, Section EI, Week 199828, Derwent Publications Ltd., London, GB; Class U21, AN 1998–320949 XP002120425.

* cited by examiner

*Primary Examiner*—Toan Tran
*Assistant Examiner*—Paul Dinh
(74) *Attorney, Agent, or Firm*—Dykema Gossett PLLC

(57) ABSTRACT

A control circuit for controlling a semiconductor component (2) comprising an emitter (E), a collector (C) and a gate (G), the control circuit comprising a gate driver (GD) the output of which is connected to the gate (G) of the semiconductor component to be controlled. The control circuit further comprises a resistance coupling (1) where two series connections of a diode (V1, V2) and a resistor (R1, R2) are in an antiparallel connection and connected between the emitter (E) of the semiconductor component (2) and the zero potential (Com) of the gate driver (GD), and a feedback capacitor (C1) connected between the collector (C) of the semiconductor component (2) and the end of the resistance coupling (1) connected to the zero potential (Com) of the gate driver.

3 Claims, 1 Drawing Sheet

CONTROL CIRCUIT

BACKGROUND OF THE INVENTION

The present invention relates to a control circuit for controlling a semiconductor component which comprises an emitter, a collector and a gate, the control circuit comprising a gate driver the output of which is connected to the gate of the semiconductor component to be controlled.

Currently used power semiconductors, such as IGB transistors, are components where turn-on and turn-off are so fast that for example when they are used in pulse width modulated frequency converters, voltage change rates with a value exceeding 10 volts per nanosecond may appear in the output voltage of the frequency converter. Such a change rate causes a significant strain on the load of the frequency converter. The frequency converter load is typically a motor, high voltage change rates thus causing a strain on the motor's winding insulation and strong voltage reflections in the motor cables. In addition, high change rates cause electromagnetic interference to radiate to the environment.

It is known to restrict the voltage change rates in power semiconductors by increasing the resistance of a gate resistor connected between the output of the gate driver controlling a semiconductor component and the gate of the semiconductor component to be controlled. This slows down the rate of increase of the power component's gate charge, whereby the gate voltage also increases slower. A shortcoming of this connection method is that it is dependent on the power component's properties and their distribution which makes the accuracy of the end result fairly poor. In addition, the resistance in the coupling unnecessarily increases losses.

BRIEF DESCRIPTION OF THE INVENTION

An object of the present invention is to provide a control circuit that allows the above shortcomings to be avoided and a semiconductor component to be reliably controlled in manner independent of the component and by using only simple and inexpensive passive components. This is achieved with a control circuit of the invention which is characterized in that the control circuit further comprises a resistance coupling where two series connections of a diode and a resistor are in an antiparallel connection and connected between an emitter of the semiconductor component and a zero potential of a gate driver, and a feedback capacitor connected between the collector of the semiconductor component and the end of the resistance coupling connected to the zero potential of the gate driver.

The invention is based on the idea that a change in the collector-emitter voltage of the semiconductor component produces a current flowing through a feedback capacitor C1, the current also flowing through resistors coupled to the emitter. The direction of the voltage change determines which one of the two resistors the current will pass through. In both cases the current causes a voltage drop in the resistors which reduces positive gate voltage of the semiconductor component on turn-on, i.e. when the collector-emitter voltage decreases, and negative gate voltage on turn-off, i.e. when the collector-emitter voltage increases. The structure of the control circuit of the invention is fairly simple and therefore cost-effective. Due to the simple structure the control circuit is also easy to implement and operationally reliable. Furthermore, in an appropriately dimensioned control circuit losses are considerably small, therefore the operating efficiency of a device utilizing the control circuit of the invention does not decrease significantly due to the limited voltage growth rate provided with the circuit.

BRIEF DESCRIPTION OF THE DRAWINGS

In the following the invention will be described in greater detail in connection with preferred embodiments and with reference to the accompanying drawings, in which.

DETAILED DESCRIPTION OF THE INVENTION

Figure 1:
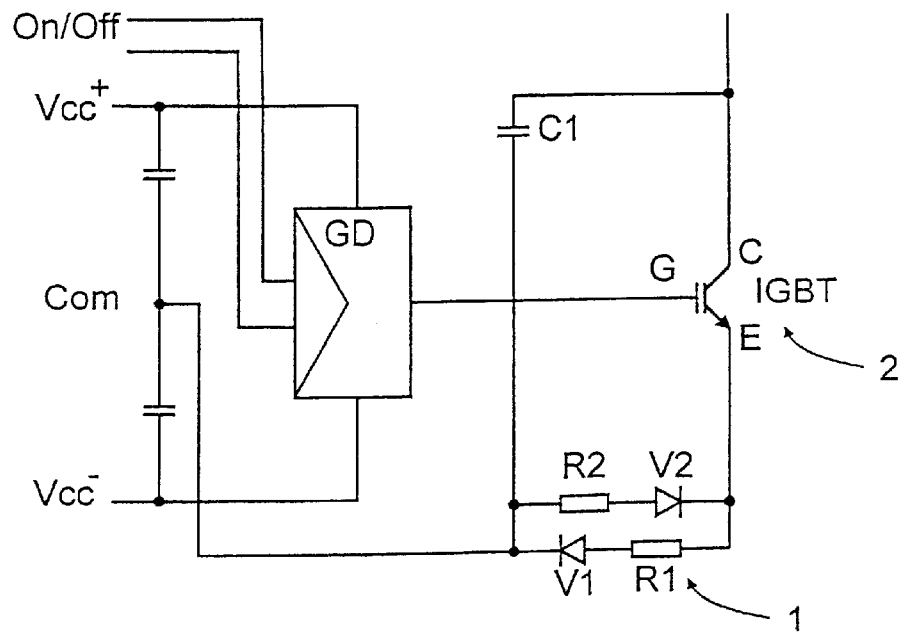
FIG. 1 illustrates a control circuit of the invention.

As shown in FIG. 1, a semiconductor component—an insulated gate bipolar transistor (IGBT) in this case—is controlled by means of a gate driver connected to the component. Prefabricated commercial circuit components are commonly used as gate drivers, but a gate driver can also be made using suitable discrete components. The main function of a gate driver is to control a semiconductor switch to a conducting state and, correspondingly, from a conducting state. In addition, after the controlling, the driver must keep the component reliably in the state to which the component has been controlled. Due to power consumption, controlling from one state to another is most advantageously carried out as rapidly as possible, because the greatest power losses in a semiconductor component, such as the IGBT, occur at the moment the controlling takes place. The gate driver in FIG. 1 applies a bipolar auxiliary voltage Vcc+, Vcc−. The component can thus be rapidly brought to a non-conducting state and, in addition, it is reliably kept in the non-conducting state by the voltage connected to the gate which is negative compared with the IGBT emitter. This prevents the component from being turned on by any induced voltage and current pulses.

The auxiliary voltages Vcc+ and Vcc− and their intermediate zero potential Com allow logic level control signals On/Off of the gate driver to be amplified to a strength that enables the semiconductor component to be controlled. The IGBT can be brought to a conducting state by applying to its gate G a voltage which is positive compared with the emitter E. The zero potential of the gate driver is connected to the IGBT emitter, thus allowing the gate driver to provide the gate with the positive and negative voltage needed for turn-on and turn-off by using the auxiliary voltages Vcc+, Vcc−.

In accordance with the invention, between a zero potential terminal of the gate driver GD and the emitter E of the semiconductor component is connected a resistor R1, with a diode V1 series-connected with it, the two having a resistor R2 parallel-connected with them, a diode V2 being series-connected with the resistor R2. In addition, between the zero potential terminal of the gate driver GD and the collector of the semiconductor component is connected a feedback capacitor C1. In the invention the diodes V1 and V2 are provided with polarity which allows the current through the capacitor C1 caused by the change in the collector-emitter voltage of the semiconductor component to flow, depending on the direction of the current, only through one resistor at a time.

At turn-on the gate driver provides its output with a voltage of the magnitude of the positive auxiliary voltage Vcc+, the voltage being typically +15 volts and producing a gate current which causes the rate voltage of the IGBT to grow from the −7 volt negative auxiliary voltage Vcc− typical at turn-off towards the about 10 volt threshold voltage of the component. When this level is reached, the IGBT moves to a conducting state and its collector voltage begins to drop. This, in turn, produces a current flowing through the capacitor C1, the resistor R1 and the diode V1, the current causing a voltage loss in the resistor R1 and diode V1 which moves the zero potential terminal Com of the gate driver to a negative direction with respect to the emitter E. When the effective gate voltage compared to the emitter potential is lower than the threshold voltage, the gate charge begins to decrease which, in turn, means that the change rate of the collector voltage decreases. This means that the current flowing through the capacitor C1 decreases and the voltage loss in R1 reduces. The extent of the voltage loss depends on the capacitance of the capacitor C1, the resistance of the resistor R1 and the change rate of the collector voltage. At suitable component values the end result is a collector voltage change rate that remains constant almost during the entire turn-on process.

At turn-off, an analog process takes place. When the gate voltage decreases to the level of the threshold voltage, the collector voltage starts to grow. The current flowing through C1 is then directed through the resistor R2 and the diode V2, and the voltage loss it causes in the resistor R2 and the diode V2 causes the zero potential of the gate driver to move to a positive direction with respect to the emitter E. The resistance of R2 is typically double or triple compared with the resistance of R1, therefore the voltage loss caused by the same amount of current is, correspondingly, also greater. A greater voltage loss is needed because the threshold voltage differs more from the negative turn-off voltage than from the positive turn-on voltage.

According to the connecting of the invention shown in FIG. 1 the resistance coupling 1 comprises two antiparallel-connected series connections of the resistor R1, R2 and the diode V1, V2. This arrangement allows the changes in the gate voltage to be separately selected for the turn-on and turn-off of the semiconductor component. It is advantageous to use two separate resistors together with diodes because at turn-on and turn-off the voltage changes needed for optimal operation are typically dissimilar. At turn-on the gate voltage is reduced to make the voltage momentarily drop below the threshold voltage needed for turning on the component before the gate voltage rises to the full positive auxiliary voltage Vcc+ of the gate driver, the value of which is typically +15 volts. At turn-on the current flows through the resistor R1 and the diode V1, a cathode of the diode V1 being connected to the feedback capacitor C1.

At turn-off the voltage drop taking place at the resistor R2 is used so as to keep the semiconductor component gate momentarily above the threshold voltage, thereby allowing the component to be turned off at a required change rate. At turn-off the gate voltage is then made equal to the negative auxiliary voltage Vcc− of the gate driver, which is typically −7 volts. At turn-off the direction of current in the feedback capacitor is different than at turn-on, therefore the diodes V1, V2 can be used to determine the gate voltage change caused by the current of different direction.

The invention is described with reference to a gate driver comprising a bipolar auxiliary voltage, but the invention can equally well be implemented in connection with a gate driver comprising a unipolar auxiliary voltage.

Figure 2:
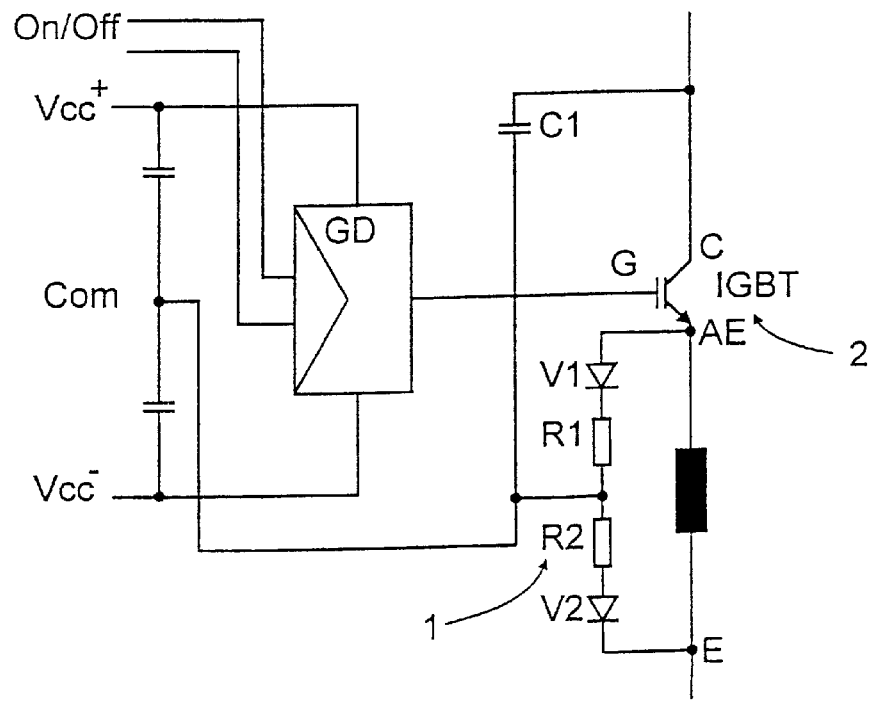
FIG. 2 illustrates a preferred embodiment of the invention.

FIG. 2 illustrates a preferred embodiment of the invention in which the diode V1, V2 and the resistor R1, R2 are series-connected by connecting one series connection from the zero potential Com of the gate driver to the auxiliary emitter AE of the semiconductor component and the other to the emitter E. The directions of the diodes in the series connections are such that to the auxiliary emitter AE of the semiconductor component is connected an anode of the diode V1 and, correspondingly, to the emitter E a cathode of the second diode V2. The auxiliary emitter is an electrode of the semiconductor component and it is typically used only for determining the potential of the semiconductor component, such as the IGBT, to allow the component to be controlled from the gate in a reliable manner. The emitter, in turn, is an electrode through which the emitter current is meant to flow. The auxiliary emitter and the emitter are in direct electric connection with each other. In the connection shown in FIG. 2 the conductor connecting the auxiliary emitter and the emitter is illustrated by stray inductance L of the emitter circuit.

The connecting shown in FIG. 2 provides all the same effects as the connecting shown in FIG. 1. An additional advantage obtained is the restriction of a strong current that would flow through the semiconductor component in the event of a short-circuit. When a short-circuit occurs, the saturation voltage of a semiconductor component, such as the IGBT, strongly grows, thus causing the feedback capacitor C1 and the resistance coupling 1 to act on further increasing the gate voltage. The preferred embodiment therefore employs the stray inductance L of the semiconductor component's emitter circuit to reduce the gate voltage in short-circuit and to thereby softly restrict the maximum value of the short-circuit current.

The emitter circuit of a power semiconductor always contains internal stray inductance, a certain amount of voltage loss being left over the inductance when the emitter current changes. The amount of the voltage drop depends for example on the rate of change of the emitter current. In a situation shown in FIG. 2, when a rapidly growing short-circuit current causes in the stray inductance L of the emitter circuit a voltage loss it is shown as a voltage between the auxiliary emitter and the emitter, the emitter being more negative than the auxiliary emitter. A point between the resistors R1 and R2 is also more negative than the auxiliary emitter which provides the reference for the semiconductor component's gate voltage.

Since the point between the resistors R1 and R2 is also the zero potential Com of the gate driver, or a common intermediate point of the positive and negative supply voltage of the gate driver, the event means that the gate voltage tends to decrease in relation to the auxiliary emitter voltage. The decrease in the gate voltage means that the current flowing through the component is restricted, which is the desired result in a short-circuit situation.

It is apparent to a person skilled in the art that as technology advances, the basic idea of the invention can be implemented in various ways. The invention and its embodiments are therefore not restricted to the above described examples but they may vary within the scope of the claims.

What is claimed is:

1. A control circuit for controlling a semiconductor component comprising an emitter, a collector and a gate, the control circuit comprising a gate driver the output of which is connected to the gate of the semiconductor component to be controlled, wherein the control circuit further comprises
   a resistance coupling including two series connections of a diode and a resistor in an antiparallel connection between the emitter of the semiconductor component and a zero potential of the gate driver; and
   a feedback capacitor connected between the collector of the semiconductor component and to the resistance coupling connected to the zero potential of the gate driver.

2. A control circuit according to claim 1 wherein the semiconductor component also comprises an auxiliary emitter, wherein the resistance coupling comprises two series connections of the diode and the resistor, a first series connection being connected between the zero potential of the gate driver and the auxiliary emitter of the semiconductor component, an anode of the diode being connected to the auxiliary emitter of the semiconductor component and a second serial connection between the zero potential of the gate driver and the emitter of the semiconductor component, a cathode of the diode being connected to the emitter of the semiconductor component.

3. A control circuit according to claim 1, wherein the semiconductor component comprises an IGB transistor.

* * * * *